(12) United States Patent
Durbhakula

(10) Patent No.: US 10,810,142 B2
(45) Date of Patent: Oct. 20, 2020

(54) ADAPTIVE SCHEDULING OF MEMORY REQUESTS

(71) Applicant: Xilinx, Inc., San Jose, CA (US)

(72) Inventor: Suryanarayana Murthy Durbhakula, Hyderabad (IN)

(73) Assignee: XILINX, INC., San Jose, CA (US)

(*) Notice: Subject to any disclaimer, the term of this patent is extended or adjusted under 35 U.S.C. 154(b) by 291 days.

(21) Appl. No.: 15/595,567

(22) Filed: May 15, 2017

(65) Prior Publication Data

US 2018/0329839 A1 Nov. 15, 2018

(51) Int. Cl.
*G06F 13/16* (2006.01)
*G11C 7/10* (2006.01)
*G06F 12/00* (2006.01)

(52) U.S. Cl.
CPC ...... *G06F 13/1626* (2013.01); *G06F 13/1642* (2013.01); *G06F 13/1657* (2013.01); *G06F 13/1673* (2013.01); *G11C 7/1072* (2013.01); *G06F 12/00* (2013.01); *G11C 7/10* (2013.01)

(58) Field of Classification Search
CPC ............. G06F 13/1626; G06F 13/1642; G06F 13/1673; G06F 13/1657; G11C 7/1072; G11C 7/10
USPC ........................................................ 711/167
See application file for complete search history.

(56) References Cited

U.S. PATENT DOCUMENTS

| 10,320,680 | B1* | 6/2019 | Mehr ..................... H04L 47/283 |
| 2009/0182945 | A1* | 7/2009 | Aviles ..................... H04L 69/16 711/122 |
| 2011/0258353 | A1 | 10/2011 | Wang |
| 2013/0007386 | A1* | 1/2013 | Wolf ....................... G06F 13/161 711/158 |
| 2013/0024864 | A1* | 1/2013 | Lakshmi ............... G06F 9/3851 718/102 |
| 2016/0110105 | A1 | 4/2016 | Karamcheti et al. |
| 2017/0315914 | A1* | 11/2017 | Muralimanohar .. G06F 13/1642 |

FOREIGN PATENT DOCUMENTS

| EP | 3113029 | 4/2017 |
| WO | 20120125149 | 9/2012 |

* cited by examiner

*Primary Examiner* — Tuan V Thai
*Assistant Examiner* — Edward Waddy, Jr.
(74) *Attorney, Agent, or Firm* — Patterson + Sheridan, LLP

(57) ABSTRACT

Apparatuses and method for an integrated circuit device are described. In an apparatus thereof, there is a plurality of memory controllers coupled to a plurality of memory banks. A network of switches is coupled to the plurality of memory controllers. A plurality of data processing devices is coupled to the network of switches and is configured to generate memory requests. A network controller is coupled to the network of switches and is configured to queue the memory requests and selectively issue requests to memory from the memory requests queued responsive to corresponding response times associated with the plurality of memory banks.

21 Claims, 9 Drawing Sheets

ADAPTIVE SCHEDULING OF MEMORY REQUESTS

FIELD OF THE INVENTION

The following description relates to integrated circuit devices ("ICs"). More particularly, the following description relates to adaptive scheduling of memory requests for an IC.

BACKGROUND

Read and write requests of memory may occur with one or more clock cycles of latency. For example, dynamic random access memory or DRAM may have a significant amount of latency. Having a significant amount of latency can negatively impact performance, including memory throughput. Hence, it is desirable to provide an IC having increased memory throughput.

SUMMARY

An apparatus relates generally to an integrated circuit device. In such an apparatus, a plurality of memory controllers are coupled to a plurality of memory banks. A network of switches is coupled to the plurality of memory controllers. A plurality of data processing devices is coupled to the network of switches and is configured to generate memory requests. A network controller is coupled to the network of switches and is configured to queue the memory requests and to selectively issue requests to memory from the memory requests queued responsive to corresponding response times associated with the plurality of memory banks.

Another apparatus relates generally to an integrated circuit device. In such an apparatus, a plurality of memory controllers is coupled to a plurality of memory banks. A network of switches is coupled to the plurality of memory controllers. A plurality of data processing devices is coupled to the network of switches and is configured to generate memory requests. A network controller is coupled to the network of switches. Switches of the network of switches are configured as arbiters. The arbiters are configured to queue and issue the memory requests queued therein responsive to corresponding response times for the plurality of memory banks.

A method relates generally to an integrated circuit device. In such a method, memory requests are generated from a plurality of data processing devices. The memory requests are queued in a network controller. The memory requests are issued responsive to corresponding response times for a plurality of memory banks addressed by the memory requests queued. The memory requests are passed through a network of switches for receipt by a plurality of memory controllers coupled to the network of switches and the plurality of memory banks.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Round-trip net time for memory requests are monitored, such as by at least one of a network controller or an arbiter. These round-trip net times or response times may be associated with memory requests to effectively identify which memory pages are open (i.e., shorter response times) and which are not (i.e., longer response times). Along those lines, memory requests associated with memory banks having shorter response times may be selected over memory requests associated with memory banks having longer response times. This preferential selection of memory requests likely to have shorter response times may be used to increase overall throughput of memory requests. In other words, memory latencies may be reduced thus improving overall performance of memory accesses.

Along those lines, circuitry is added in order to provide information at a network controller and/or arbiter level to identify which pages in memory are currently active. Such circuitry is used to determine round-trip times for memory requests and to maintain running averages associated with such round-trip times for such memory requests. From a read or write memory address, a page or column address can be determined. For a page address, it may be determined whether any outstanding memory requests at a network controller and/or arbiter match such page address. Matching page addresses having a lowest average round-trip time or average service time may be selected or given priority over memory requests not having matching page addresses.

With the above general understanding borne in mind, various configurations for adaptive scheduling of memory requests are generally described below.

Figure 1:
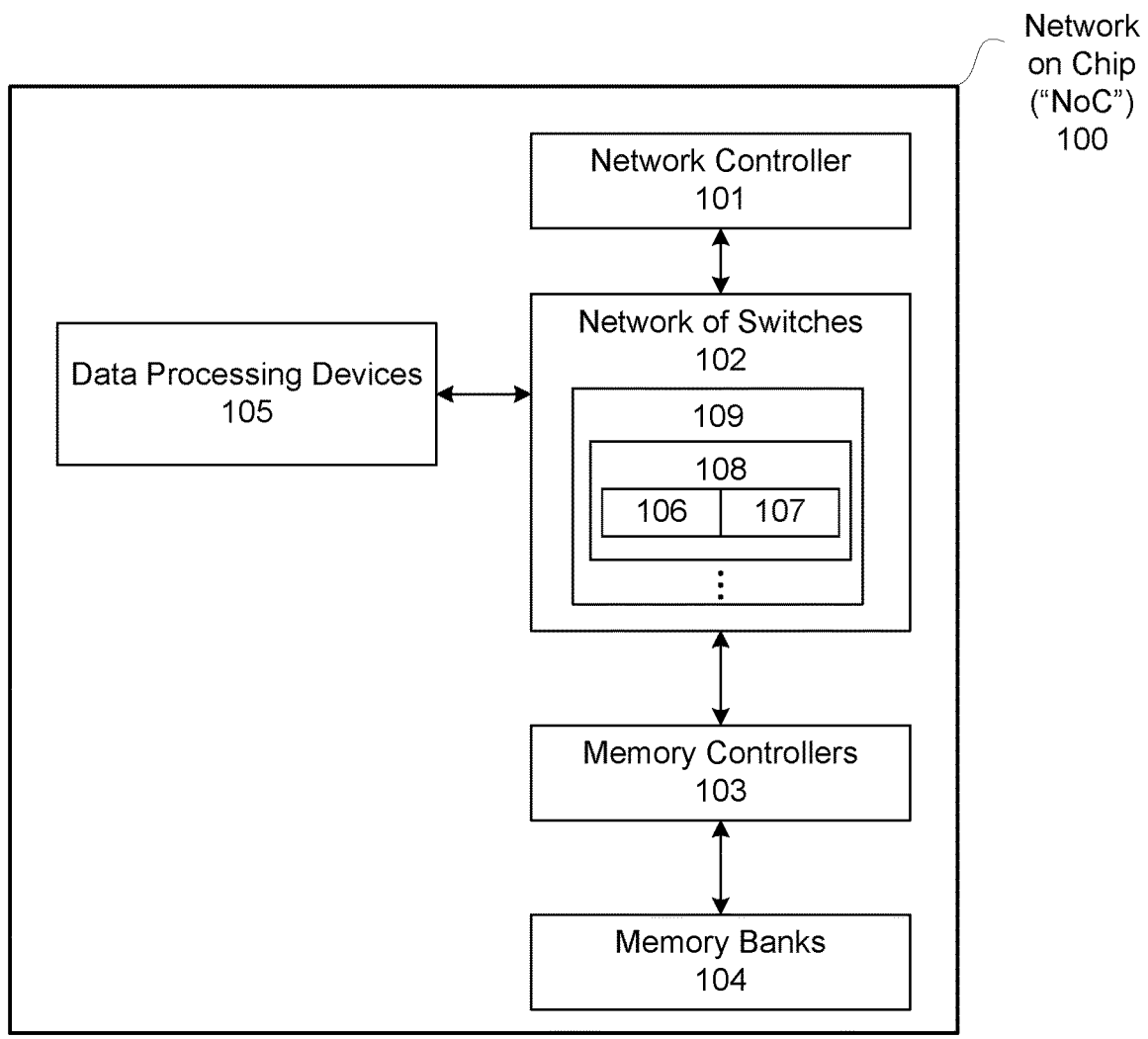
FIG. 1 is a block diagram depicting an exemplary network-on-chip ("NoC").

FIG. 1 is a block diagram depicting an exemplary network-on-chip ("NoC") 100. NoC 100 may be an apparatus of an integrated circuit device.

NoC 100 may include memory controllers 103, memory banks 104, network of switches 102, data processing devices 105, and a network controller 101. By data processing devices 105 it is generally meant integrated circuit devices configured to handle and/or process data.

Memory controllers 103 may be coupled to memory banks 104. Network of switches 102 may be coupled to memory controllers 103. Each programmable tile 108 in programmable hardware fabric 109 of an integrated circuit may include both programmable interconnect circuits 106 and programmable logic circuits 107. Programmable interconnect circuits 106 may include a number of interconnect lines of varying lengths interconnected by programmable interconnect points ("PIPs"). These programmable interconnect circuits 106, such as of an FPGA for example, may programmed to instantiate a network of switches 102. Data processing devices 105 may be coupled to network of switches 102. Data processing devices may be configured to generate memory requests, as described below in additional detail.

Network controller 101 may be coupled to network of switches 102. Network controller 101 may be configured to queue memory requests, as described below in additional detail. Memory controller 101 may be configured to selectively issue requests to memory from memory requests queued responsive to corresponding response times associated with memory banks addressed in such memory requests queued, as described below in additional detail.

Generally, for multiple memory requests, such as for example multiple DRAM read requests from data processing devices 105, queued up at network controller 101 (or an arbiter as described below), response times may be determined using registers and counters. These response times may be used to understand how long particular memory requests are taking to complete. For a memory address for page accessible memory or page memory, a row buffer and a memory bank may be identified and/or identifiable from such memory address as is known. By tracking requests and associated response times for each memory bank, including keeping running averages of service times or round-trip times per memory bank, memory requests may be selected from a queue thereof, such as at a network controller 101 (or an arbiter as described below) to send to memory controllers for such memory banks having fastest response times, or more particularly for memory banks having shortest running average response or service times.

Figure 2:
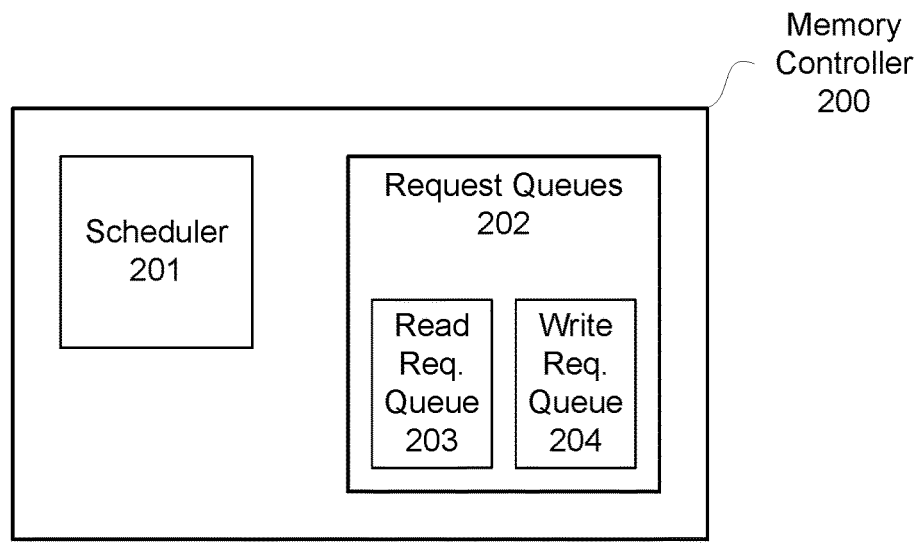
FIG. 2 is a block diagram depicting an exemplary memory controller.

FIG. 2 is a block diagram depicting an exemplary memory controller 200. Memory controller 200 may be an example of a memory controller of memory controllers 103 of FIG. 1.

Memory controller 200 may include a scheduler 201 and one or more memory request queues ("request queues") 202. Generally, request queues 202 may include a read request queue 203 and a write request queue 204. However, a read-only implementation of memory may be used, where request queues 202 may for example include only a single memory read request queue.

Figure 3:
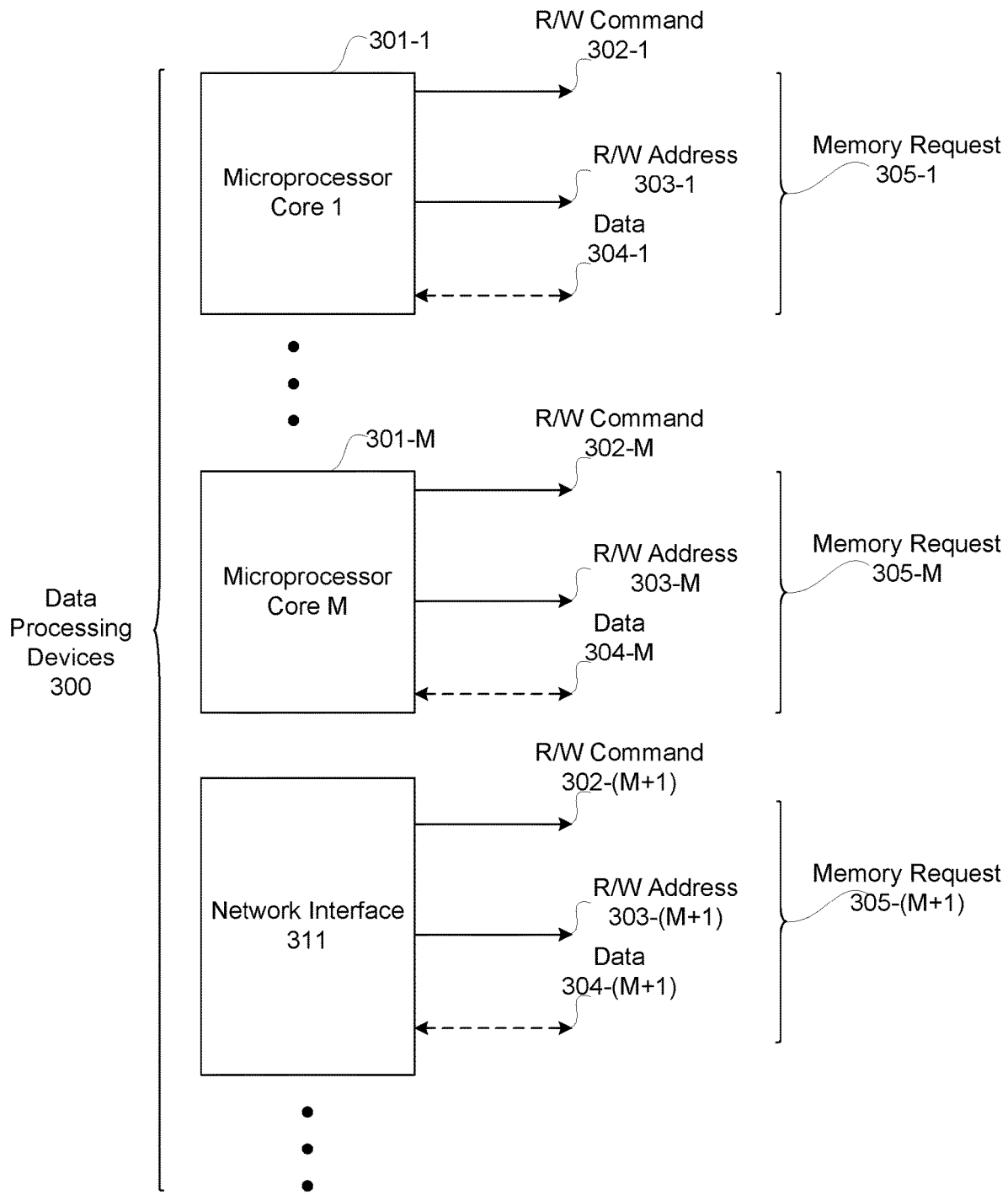
FIG. 3 is a block diagram depicting an exemplary set of data processing devices.

FIG. 3 is a block diagram depicting an exemplary set of data processing devices 300. Data processing devices 300 may be an example of a set of data processing devices 105 of FIG. 1. However, fewer or more data processing devices than those depicted for data processing devices 300 may be used. Moreover, other types of data processing devices, namely other than those in the example depicted, may be used for data processing devices 300, and other configurations of data processing devices, namely other than those in the example depicted, may be used for data processing devices 300.

In this example, data processing devices 300 include microprocessor cores 301-1 through 301-M (collectively "microprocessor cores 301") and a network interface 311. Microprocessor cores 301 may be of one or more microprocessors, including without limitation one or more multi-core microprocessors. Examples of microprocessors include those from Intel, ARM, and AMD, among others.

Microprocessor cores 301 may respectively issue memory requests. For memory requests 305-1 through 305-M respectively of microprocessor cores 301-1 through 301-M, such microprocessor cores 301 may respectively issue a read or write ("R/W") command 302-1 through 302-M and a corresponding R/W address 303-1 through 303-M to read or write data 304-1 through 304-M, respectively. For a memory request, 305-(M+1), a network interface 311 may respectively issue an R/W command 302-(M+1) and a corresponding R/W address 303-(M+1) to read or write data 304-(M+1), respectively. For example, microprocessor core 301-M may issue a read or write ("R/W") command 302-M with a corresponding R/W address 303-M. Such R/W address 303-M indicates where in memory banks 104 of FIG. 1 data is to be read from or written to corresponding to a R/W memory request. Data read from memory at a read address responsive to completion of a read command may optionally be provided back to a requesting data processing device, as generally indicated as data 304-M, or sent elsewhere as is known. Likewise, data to be written to memory at a write address may optionally be provided from a requesting data processing device, as generally indicated as data 304-M.

Along the above lines, there may be memory requests 305-1 through 305-M+1 from M+1 data processing devices 300, for M a positive integer greater than 1. While there may be M+1 data processing devices 300 or "requestors" issuing M+1 requests at/or within a same time interval, the number of outstanding or pending requests at a time may be limited by a maximum number of requests which may be supported by a network controller, such as network controller 101 of FIG. 1 for example. Moreover, a same requestor may have more than one outstanding request at a time.

The following description is for memory requests, whether memory read commands and/or memory write commands, that can be executed in an out-of-sequence order. Along those lines, it shall be understood that queued memory requests may be selected or picked, and these selected memory requests from a memory request queue may be selected in an out-of-order sequence to improve performance.

For purposes of clarity by way of example and not limitation, the following description is generally for memory banks 104 of FIG. 1 being DRAM memory banks accessible with page reads and/or page writes. However, it will be appreciated that other types of memory having page or similar accesses may be used.

Figure 4:
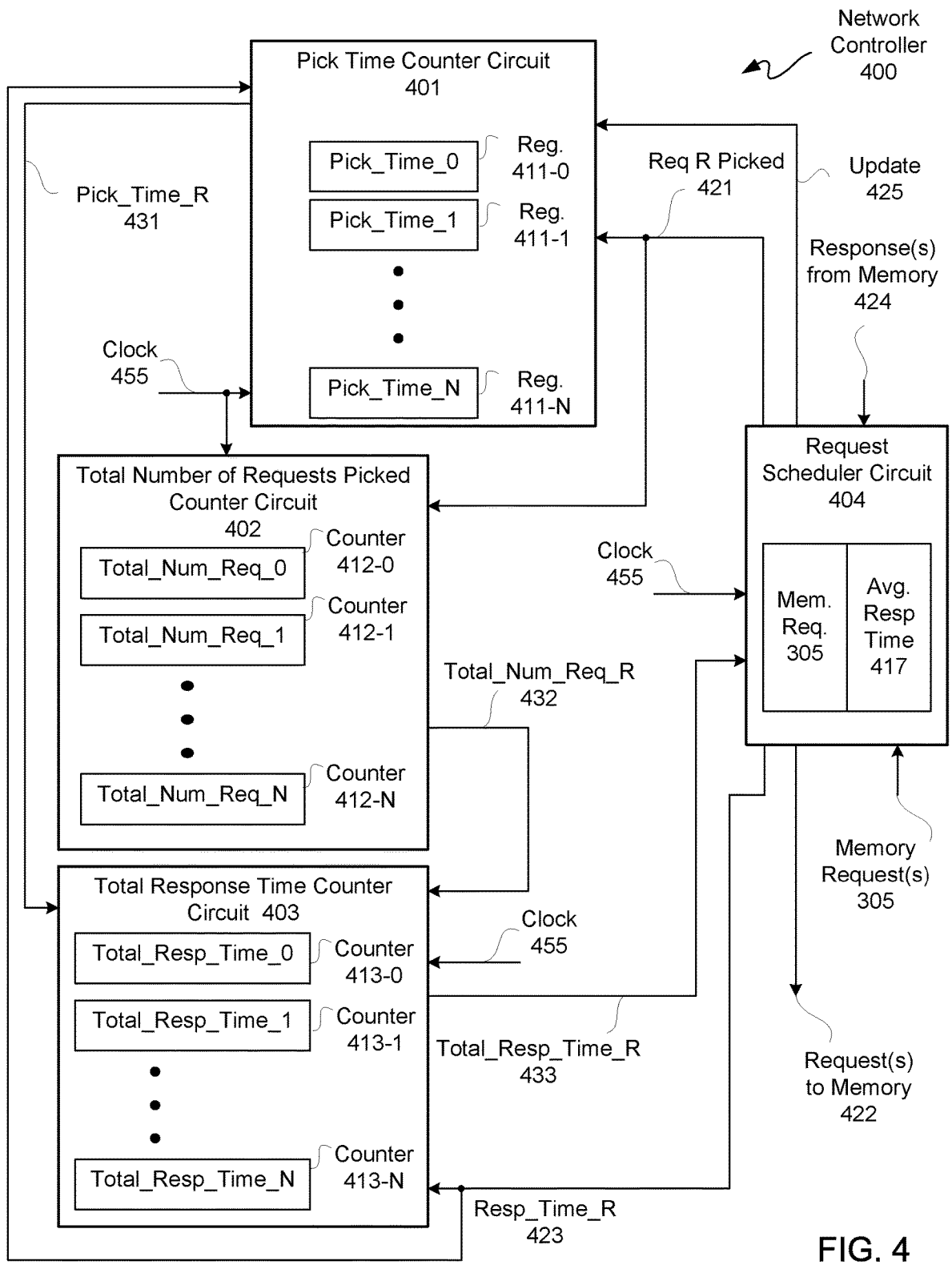
FIG. 4 is a block diagram depicting an exemplary network controller.

FIG. 4 is a block diagram depicting an exemplary network controller 400. Network control 400 may be an example of a network controller 101 of FIG. 1. With simultaneous reference to FIGS. 1 through 4, network controller 400 is further described.

Network controller 400 may include a "pick time counter" circuit 401, a total number of requests picked counter circuit ("requests picked counter") 402, a total response time counter circuit ("response time counter") 403, and a request scheduler circuit ("request scheduler") 404. Pick time counter 401 may be a register file having registers 411-0 through 411-N (collectively "registers 411").

One or more memory requests 305 are provided from data processing devices 300 to request scheduler 404. Data processing devices 300 may provide such memory requests 305 via network of switches 102 to network controller 400 for request scheduler 404.

For a memory request ("R") picked or selected by request scheduler 404 from a memory request 305 queued in request scheduler 404, request scheduler 404 responsive to such selection sends such selected request to memory, namely request to memory signal 422 or request R to memory 422, and indicates which request is selected, namely a request R picked signal 421. A current time for a received request R picked signal 421 may be stored in a register 411-R for a memory request R associated with such signal, for R an integer between 0 and N, inclusive. Integer N may be at least the number of outstanding requests network controller 400 can support. Integer N may thus be a constant.

A current time may be stored in a register 411-R of pick time counter 401. Thus, effectively pick time counter 401 may be used to store a count of active pick times for network controller issued memory requests. Each register 411 having a stored pick time is associated with a corresponding request R.

Timing of sending of signals, as well as other timing as described herein, may be provided by clocking counters 401 through 403, as well as request scheduler 404, with a same clock signal 455. Other known types of signals such as set, reset, clear, power, ground, and others are not illustratively depicted for purposes of clarity and not limitation.

A queued request, whether a read or write request, selected by request scheduler 404 to be an issued request R to memory 422 may further be used to increment a corresponding counter R. Along those lines, request R picked signal 421 may be sent to both pick time counter 401 and requests picked counter 402.

Requests picked counter 402 may include counters 412-0 through 412-N (collectively "counters 412") corresponding to registers 411. Along those lines, a counter 412-R of counters 412 may be incremented responsive to assertion of request R picked signal 421. Accordingly, each of counters 412 may store a requests count responsive to incrementing by request R picked signal 421 for each corresponding pick time value of active pick times stored in pick time counter circuit 401 registers 411.

There may be a same maximum value for each of counters 412. When a counter 412-R reaches such a maximum value after incrementing, such counter 412-R may be kept at such saturated value, namely held at the maximum value set for such counter 412-R. For example, for a 3-bit counter, a maximum value may be a numerical value of 7, and such counter 412-R may be successively incremented to 7 and then kept at such count of 7 thereafter.

After an issued request R to memory 422 is completed, a response from memory signal 424 or response for R from memory signal 424 to request scheduler 404 may be received. Such a response from memory signal 424 may be used to indicate completion of such requested task in a corresponding request R to memory 422. Along those lines, an update counter signal 425 may be provided from request scheduler 404 to pick time counter 401 for a register 411-R to clear such register responsive to a completed memory request R.

For a response from memory 424 received by request scheduler 404, such response includes a value of time at which a corresponding request R was completed. This value of time is referred to as a response time for R. For a read request to memory 422, a corresponding response from memory 424 may further include data read from memory responsive to completion of such read request.

A response time or a completion time for R may be provided from request scheduler 404 to response time counter 403 as response or completion time ("response time") R signal 423. Response time counter 403 may include counter circuits 413-0 through 413-N (collectively "counters 413"). A counter 413-R of counters 413 may receive response time R signal 423.

Such a counter 413-R of counters 413 may further receive the following corresponding signals: pick time R signal 431 from a register 411-R of registers 411 of pick time counter 401, and total number of requests for R signal 432 from a counter 412-R of requests picked counter 402. Counters 413 of response time counter circuit 403 may be configured to determine a total response time for R and generate a corresponding signal, namely total response time R signal 433. This total response time for R may include subtracting a pick time value for a request R obtained from a register 411-R from a received response time value for a completed request R from a response time R signal 423. A total response time R signal 433 for a completed memory request R may be sent from a counter 413-R to request scheduler 404.

Request scheduler 404 may be configured to queue memory requests 305 in association with corresponding average response times 417, as described below in additional detail. Using average response times 417, request scheduler 404 may pick of which of memory requests 305 to issue. This issuance may be for out-of-order sequencing to enhance throughput.

Optionally, suppose N response times are being tracked for N corresponding to a total number of outstanding requests. Additionally, suppose a memory bank number B is obtained from a memory address in such N requests, and response time for such memory bank B is tracked. This assumes that the total number of memory banks is greater than N, which is generally true. However, it is possible that out of N requests there may be multiple memory requests to a same bank number, such as to memory bank B for example. For example, a portion of a memory address, from which a bank number B is extracted, is the same for two or more memory requests of memory requests N. If memory response time corresponding to this memory bank B is lowest, a decision as to which of these two or more memory requests to a same memory bank B is to be sent first. In this example, request scheduler 404 is configured to send a first received one of such two or more memory requests to memory bank B. However, in another example, another criteria may be used to determine which one of same memory bank requests to send first.

Returning to FIG. 3 with continued reference to FIG. 4, each of data processing devices 300 is a potential requestor which may issue multiple requests and thus may have multiple outstanding requests at a time. The integer N may be at least the maximum number of outstanding requests a network controller 400 may support for all requestors at a time. However, the value of N may be in excess of such a maximum number. Along those lines, counters 401 through 403 may each have sets of circuits maintained per requestor.

Along those lines for example, a subset of registers 411, a subset of counters 412, and a subset of counters 413 may each be separately maintained or segregated for exclusive use by a microprocessor core of microprocessor cores 301, namely a requestor of data processing devices 300. However, a request scheduler 404 may oversee or supervise all of such registers 411, counters 412 and counters 413.

Suppose for example a total number of memory banks is 32, though some other number may be used, and suppose the maximum number of outstanding requests N is 8, though some other number may be used. In such an example, at most only 8 memory response times are tracked at a time. If in this example, all 8 response times are currently being tracked for memory banks B0, B1, B2, B3, B4, B5, B6, B7. If in this example a memory request is completed as associated with memory bank B0, and another memory request is received for a memory bank B10 (i.e., memory bank number 10). Along those lines, a response time circuitry, as described herein, previously used for tracking response time for memory bank B0 may be reused for tracking response time for memory bank B10. Because the example request for memory bank B0 is done and there is currently no other outstanding requests to memory bank B0, circuitry previously assigned for tracking response time(s) to memory bank B0 may be reused or reassigned to tracking response time(s) to memory bank B10 in this example.

Figure 5:
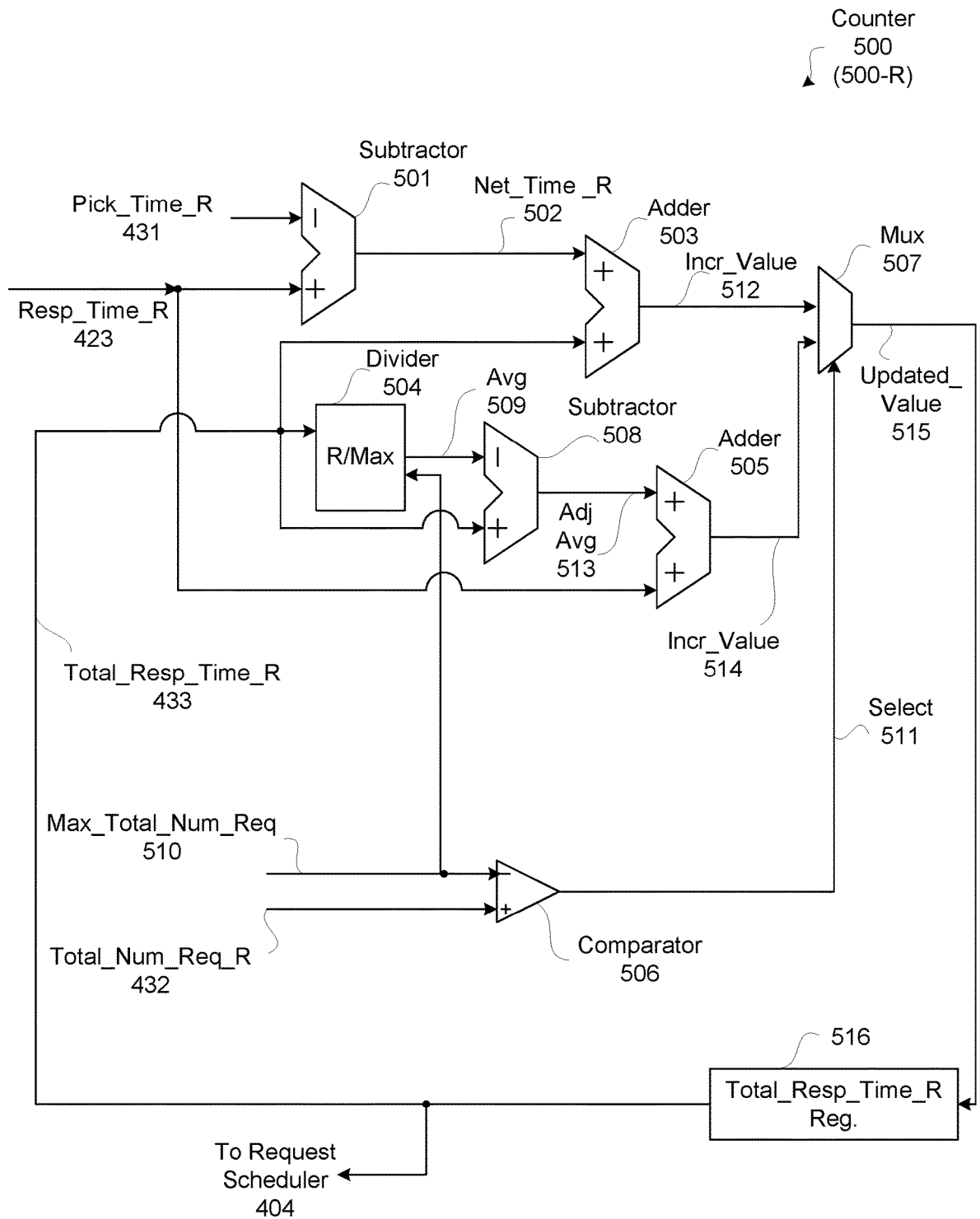
FIG. 5 is a schematic diagram depicting an exemplary stateful counter.

FIG. 5 is a schematic diagram depicting an exemplary stateful counter 500. In other words, counter 500 may be configured to have an output dependent upon whether number of requests R is less than or more than a maximum total number of requests for which such counter is configured.

Counter 500 may be a counter 413 of FIG. 4, and for purposes of clarity and not limitation, counter 500 is described as being for a corresponding request R. Along those lines, counter 500-R is described with simultaneous reference to FIGS. 4 and 5.

Counter 500-R may include a subtractor 501, an adder 503, a divider 504, an adder 505, a digital comparator 506, a multiplexer ("mux") 507, a subtractor 508, and a total response time for R register 516. A pick time R signal 431 may be coupled to a minus port of subtractor 501. A response time R signal 423 may be coupled to a plus port of subtractor 501 and to a plus port of adder 505.

Subtractor 501 may be configured to determine a difference by subtracting a pick time of pick time R signal 431 from a response time of response time R signal 423 for a completed issued memory request R. This difference is referred to as net time R signal 502, which may be input to a plus port of adder 503.

Another plus port of adder 503 may be coupled to receive a current total response time for R vial total response time R signal 433. Total response time R signal 433 may be input to a numerator port of a divider 504.

Output of adder 503 may be a total value of net time R signal 502 and a current total response time R, which is referred to as incremented value 512. Incremented value 512 is provided to a data input port of mux 507.

A divisor port of divider 504 may be coupled to receive a maximum total number of requests signal 510. A maximum total number of requests value for a maximum total number of requests signal 510 may be a preset threshold value.

Divider 504 may be configured to divide a total response time for R by a maximum total number of requests value set to obtain an average, which may be output from divider 504 as average signal 509. Average signal 509 may be input to a minus port of subtractor 508. A total response time for R value may be input from a current total response time R signal 433 to a plus port of subtractor 508 to obtain an adjusted average signal 513. By subtracting an average from average signal 509 from a current total response time for R value from total response time R signal 433 effectively a portion of a prior response time may be removed to provide an adjusted average.

To update an adjusted average with a response time anew, a response time R value from response time R signal 423 may be input to a plus port of adder 505. Adjusted average signal 513 may be input to another plus port of adder 505. Adder 505 may be configured to add a current adjusted average value for R of adjusted average signal 513 with a response time anew for R to output an incremented value signal 514. Incremented value signal 514 may be input to another data port of mux 507. Effectively incremented value signal is an updating of an adjusted average response time for R with a newly received response time for R.

A minus port of comparator 506 may be coupled to receive a maximum total number of requests allowed preset value via maximum total number of requests signal 504. A plus port of comparator 506 may be coupled to receive a current total number of requests for R via total number of requests R signal 432. Output of comparator 506 may be used to provide a digital 1 or 0 control select signal to mux 507.

For output of comparator 506 a digital 1 for a control select signal 511 input to mux 507, incremented value signal 512 may be output from mux 507 as an updated value signal 515. For output of comparator 506 a digital 0 for control select signal 511 input to mux 507, incremented value signal 514 may be output from mux 507 as an updated value signal 515. Updated value signal 515 may have an updated total response time for R value. Updated value signal 515 may be coupled to a data input port of total response time for R register 516 to temporarily store such an updated total response time for R value.

A total response time for R value of a total response time R signal 433 may be sourced from a data output port of total response time for R register 516. A total response time for R value of a total response time R signal 433 may be output to request scheduler 404.

Generally, network controller 400 may be configured to determine a difference between a pick time and a corresponding response time for each completed memory request issued to obtain a corresponding total response time for each such completed request. Because memory requests include memory addresses, a network controller may be configured to associate addresses of memory requests queued with the corresponding response times, as described below in additional detail.

Figure 6:
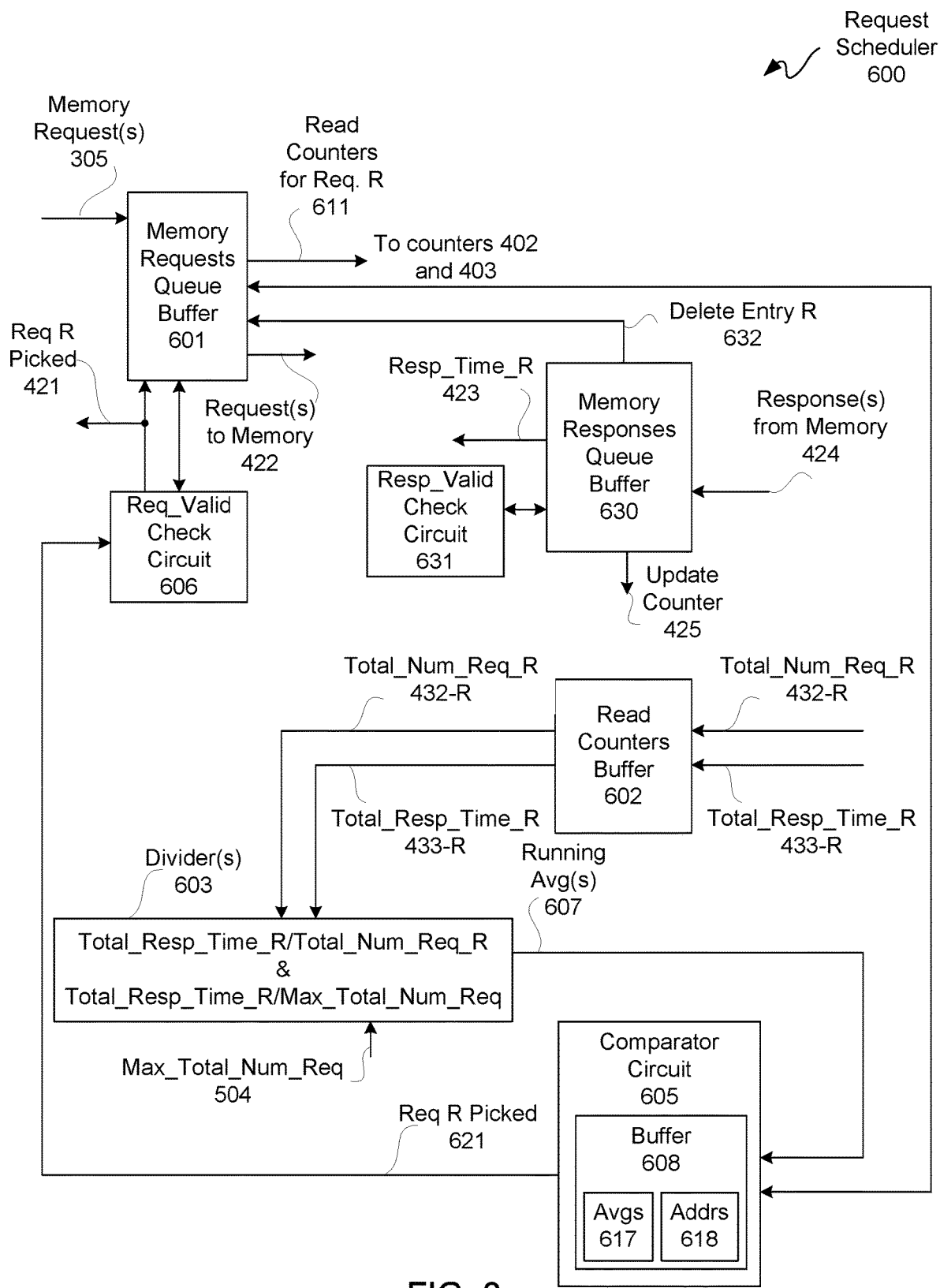
FIG. 6 is a block diagram depicting an exemplary request scheduler.

FIG. 6 is a block diagram depicting an exemplary request scheduler 600. Request scheduler 600 is an example of a request scheduler 404. Request scheduler is further described with simultaneous reference to FIGS. 4 through 6.

Request scheduler 600 may include memory requests queue buffer 601, memory responses queue buffer 630, optional request valid check circuit 606, optional response valid check circuit 631, read counters buffer 602, dividers 603, running averages buffer 608, and comparator circuit 605. Memory requests 305 may be received by and queued in memory requests queue buffer 601. Memory requests queue buffer 601, as well as all other buffers of request schedule 600, may be implemented with corresponding register files for this example with clocking using clock signal 455 (not shown in FIG. 6 for purposes of clarity).

However, in other examples, registers or other types of temporary data storage may be used.

Responsive to receiving a memory request R, memory requests queue buffer 601 may be configured to issue a read counters for request R command signal ("read counters signal") 611. Read counters signal 611 may be provided to counters 402 and 403 to read contents thereof.

In response to read counters signal 611, contents of counter 412-R and counter 413-R, the latter of which may be contents of total response time R register 516 of counter 413-R, may be respectively provided as total number of requests for R signal 432-R and total response time for R signal 433-R. Values for signals 432-R and 433-R for counters 412-R and 413-R, respectively, may be loaded into read counters buffer 602. These total response time and total number of requests for R values may be read out of read counters buffer 602, generally as signals 432-R and 433-R.

Optionally, one or more divider(s) 603 may be coupled to receive signals 432-R and 433-R. A divider of divider(s) 603 may be configured to divide a total response time for R of signal 433-R, namely a running total response time, by total number of requests for R of signal 432-R, namely a running number of requests, to provide a running average response time for R in running average(s) signal 607.

Optionally, a running average service time may be determined in another divider of divider(s) 603. A divider of divider(s) 603 may be configured to divide a total response time for R of signal 433-R by a maximum total number of requests in maximum total number of requests signal 504 to provide a running average service time for R in running average(s) signal 607.

Either or both of running average response time or running average service time for R may be output from divider(s) 603 in running average(s) signal 607 for buffering in running average(s) buffer 608. For purposes of clarity by way of example and not limitation, it shall be assumed that only a running average response time is used, even though in another example either or both a running average response time and a running average service time may be used.

A comparator circuit 605 may be coupled to or include a running averages buffer 608. Comparator circuit 605 may be coupled to memory requests queue buffer 601 to receive memory addresses for issued memory requests.

Comparator circuit 605 may optionally include a buffer 608 to store running average response times, namely running averages 617, in association with corresponding memory addresses, namely addresses 618. Memory addresses 618 may optionally be obtained from memory requests in memory requests queue buffer 601 for issued memory request(s) 422. Running averages 617 generated for corresponding response times may be for memory banks and such memory banks may be associated for each request R response time using memory addresses 618 for associated issued memory requests 422.

Comparator 605 may be configured to determine a lowest running average of running averages 617. Comparator 605 may be configured to select such a lowest running average to provide a request R picked signal 621. For ties of two or more lowest running averages, comparator 605 may be configured to obtain arrival data of memory requests from memory requests queue buffer 601. Along those lines, priority may be provided to a memory request R having been stored for a longest time in buffer 601 and having a memory address associated with a memory bank with a then current lowest running average. Request R picked signal 621 may be used for issuing a memory request out of memory requests queue buffer 601 of memory requests queued for a memory bank of memory banks 104 of FIG. 1 having the then lowest running average.

Request R picked signal 621 may optionally be provided to a request valid check circuit 606. Each memory request 305 may be provided with a request valid control signal (not shown). Request valid check circuit 606 may be coupled to memory requests queue buffer 601 to obtain such request valid control information to validate a request R picked signal 621. For a valid request R picked signal 621, request valid check circuit 606 may issue a request R picked signal 421 to update a register 411-R and a counter 412-R, as previously described. A validated request R picked signal 421 may be provided to buffer 601 to cause buffer 601 to issue a request to memory 422 for a memory request R associated with such signal.

For a completed request to memory 422, such as a read of a memory or a write to memory, as applicable, a response from memory 424 may be received by memory responses queue buffer 630. Accordingly, responses from memory 424, such as from memory banks 104 via memory controllers 103 and network of switches 102 of FIG. 1, may be buffered in memory responses queue buffer 630.

Responses from memory 424 include corresponding response times and response valid control information. Response valid control information for a response from memory 424 for a memory request R may be provided from buffer 630 to response valid check circuit 631 for validation. For an invalid response, response valid check circuit 631 may be used to delete such entry from buffer 630.

From received responses from memory 424, corresponding response times 423 may be obtained from validated entries. Along those lines, as previously described, a response time R signal 423 may be used for providing such response times from buffer 630.

Buffer 630 may be used to provide a delete entry R signal 632 to buffer 601 to delete a pending memory request in buffer 601 as having been completed and valid. Along those lines, for a completed memory request R, buffer 630 may be configured to assert an update counter signal 425 for a register 411-R in counter 401.

Association between memory request and response may vary from application-to-application, as such association is implementation dependent. In the above example, page memory addresses are used to identify memory banks associated with memory requests R and to associate such memory banks identified with corresponding response times for completion of such memory requests R. In an example, only currently open memory banks, including newly opened memory banks, with page memory accesses may be tracked. Even though examples of memory addresses were used for tracking and associating, unique identifiers may be used for each request, and when a response or reply comes back with such a unique identifier for a request an association may be formed. There are many other known examples of forming associations as between memory requests and responses.

Figure 7:
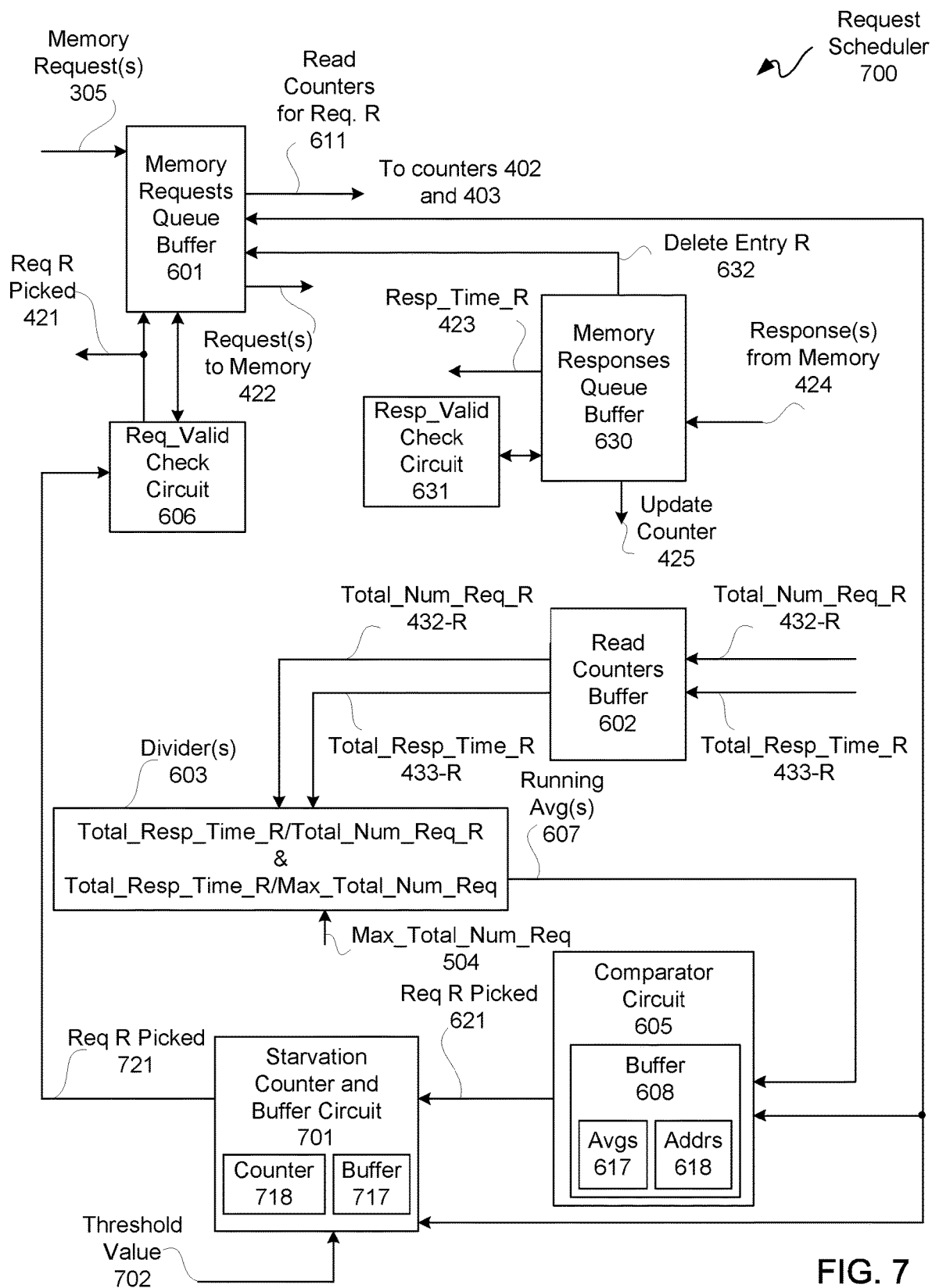
FIG. 7 is a block diagram depicting another exemplary request scheduler.

FIG. 7 is a block diagram depicting another exemplary request scheduler 700. Request scheduler 700 is another example of a request scheduler 404. Effectively, request scheduler 700 is request scheduler 600 though with a starvation counter and buffer circuit 701. Accordingly, same description is not repeated for purposes of clarity and not limitation.

A request R picked signal 621 output from comparator circuit 605 may be provided to starvation counter and buffer circuit 701. Starvation counter and buffer circuit 701 may be coupled to receive memory requests 305. Starvation counter and buffer circuit 701 may be configured with a buffer 717 coupled to receive memory request data from buffer 601.

A counter 718 of starvation counter and buffer circuit 701 may be configured to count each instance of a memory request being queued and not selected for issuance for each of such memory requests queued and not issued to provide a corresponding starvation count for each unselected queued memory request. A starvation count may be stored for an unselected memory request in buffer 717.

Starvation counter and buffer circuit 701 may be coupled to receive a preset threshold value 702. Starvation counter and buffer circuit 701 may be configured to issue each memory request of memory requests queued in buffer 717 and not previously selected for issuance responsive to a corresponding starvation count of associated starvation counts exceeding a starvation threshold value 702.

Starvation counter and buffer circuit 701 may be configured to allow request R picked signal 621 to pass through to as request R picked signal 721 for no starvation count in excess of starvation threshold value 702. In other words, for all starvation counts below or equal to a starvation threshold value 702, a memory request with a least average service or response time may be selected. Otherwise, if there is any starvation count in excess of a starvation threshold value 702, for each and every starvation count in excess of such a starvation threshold value 702, starvation counter and buffer circuit 701 may be configured to select each and all of such memory requests R having such excess starvation counts for a succession of request R picked signals 721. For each memory request issued responsive to its corresponding starvation count, such starvation counter therefor of counter 718 is reset to zero.

Memory requests queue buffer 601 may be used to remove or delete memory requests from buffer 717, such as for completed memory requests as previously described. A request R picked signal 721 may be subsequently processed as described for request R picked signal 621 as described with reference to FIG. 6.

With the above-description borne in mind, it should be appreciated that picking or selecting memory requests to provide priority processing with starvation counts is adaptive. Along those lines, if a page of memory is closed because of a starved request or for another reason, then a running average service time for memory requests to each closed page increases. Selection favors open pages with active memory requests with lower priority to memory requests with closed pages and few active memory requests.

The aforementioned described hierarchy of a NoC 100 of FIG. 1 may be pushed down from network controller 101. Along those lines, one or more arbiters may be included in network of switches 102.

Figure 8:
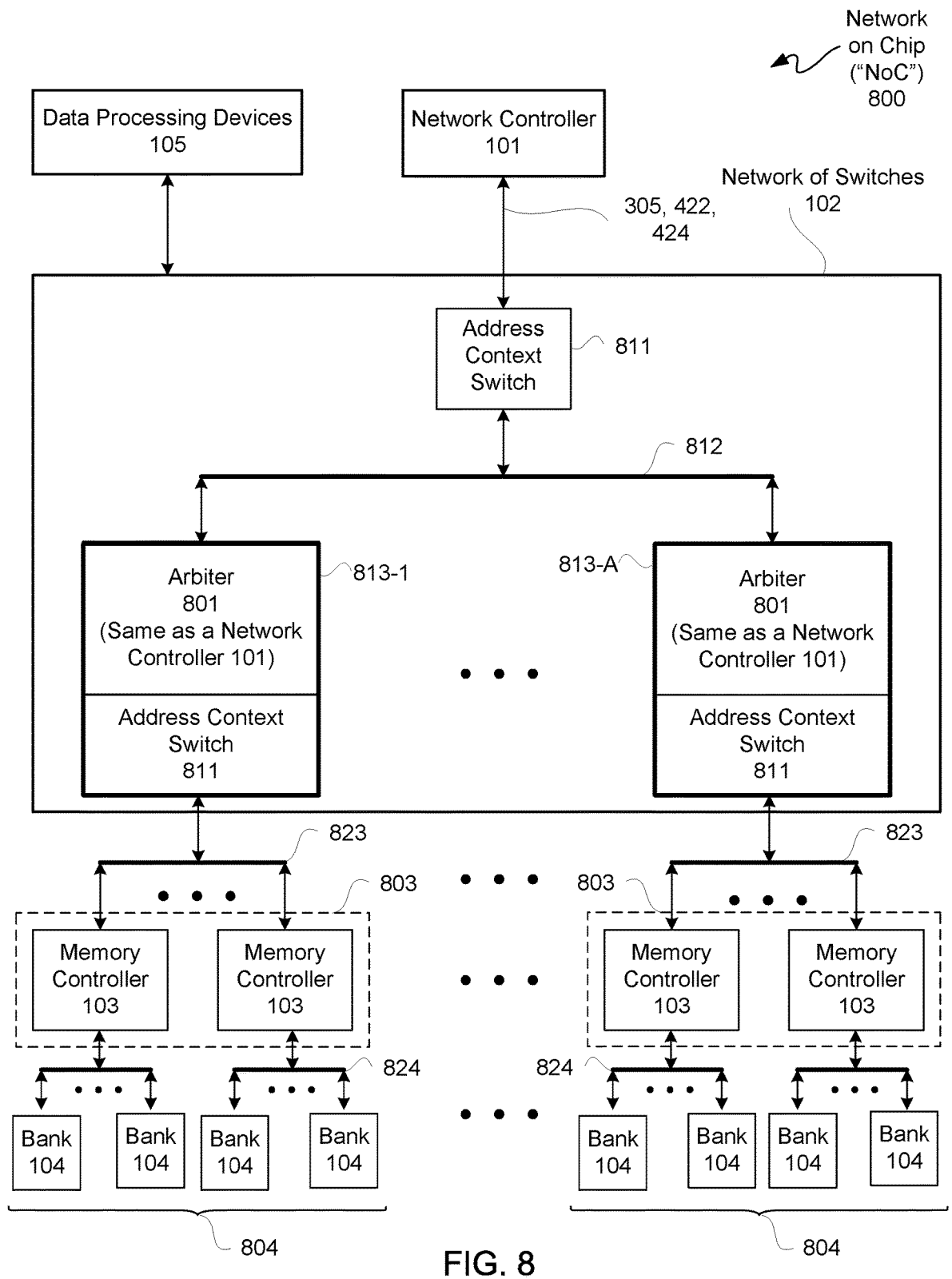
FIG. 8 is a block diagram depicting another exemplary NoC.

FIG. 8 is a block diagram depicting an exemplary NoC 800. As NoC 800 of FIG. 8 has some same components as NoC 100 of FIG. 1, generally just the differences are described for purposes of clarity and not limitation.

Network controller 101 may be as previously described, such as for example with reference to network controller 400 of FIG. 4. Alternatively, a conventional network controller may be used as a master networking unit. For purposes of clarity by way of example and not limitation, it shall be assumed that network controller 101 is network controller 400 of FIG. 4.

Memory request 305 may be provided to network controller 101, and network controller 101 may issue requests to memory 422 selected responsive at least in part to running average times, as previously described. Responses from memory 424 may be provided to network controller 101 in response to such issued requests to memory 422.

Such information 305, 422, and 424 may pass through an address context switch 811 of network of switches 102. By address context switch 811 it is generally meant that a path taken through network of switches 102 to a particular memory controller and in turn a particular memory bank or particular memory banks is based on memory addresses. Other traffic routed through network of switches 102 may not be based on memory addresses; however, directing of upstream traffic from memory controllers is known and thus not described herein for purposes of clarity.

An integer A number of switch circuits ("switches") 813-1 through 813-A, for A positive integer greater than 1 may be coupled to address context switch 811 through a signal buss 812. Each of switches 813-1 through 813-A may include an arbiter 801 and an address context switch 811.

Each arbiter 801 may be configured the same as network controller 101. However, each arbiter 801 may be for accessing a subset 803 of memory controllers 103. Each subset 803 of memory controllers 103 may be for accessing a subset 804 of memory banks 104. A subset 803 may be coupled to a corresponding subset 804 through signal busses 824.

Each of switch 813-1 through 813-A may include an arbiter 801 and an address context switch 811 coupled to one another. Such address context switch 811 of each of switches 813-1 through 813-A may be for a corresponding subset 803 of memory controllers 103 and thus a subset 804 of memory banks 104. Address context switches 811 of switches 813 may be coupled through corresponding signal busses 823 to associated subsets 803 of memory controllers 103.

Along the above-described lines of network controller 101, an arbiter 801 may be configured to receive a subset of memory requests issued from a network controller, queue such subset of memory requests received, and issue a memory request from such subset of memory requests queued responsive to corresponding response times for an associated subset 804 of memory banks 104 addressed by such memory requests queued in arbiter 801.

At least a subset of switches of network of switches 102 may configured as arbiters 801. Such arbiters 801 may be configured to queue and issue memory requests for a subset 804 of memory banks 104. Each arbiter 801 may be configured to determine differences between a pick time and a corresponding response time for each of the memory requests issued from such arbiters 801 to obtain corresponding response times, as previously described for network controller 101. Each of arbiters 801 may be configured to associate addresses of memory requests queued therein with corresponding response times. Thus, each of the above-described functions of network controller 101 may be performed by an arbiter 801, though for a subset of a memory addressable range. Thus, each of arbiters 801 may be configured like a network controller 101, such as a network controller 400 having a request scheduler 600 or 700 for example.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 9:
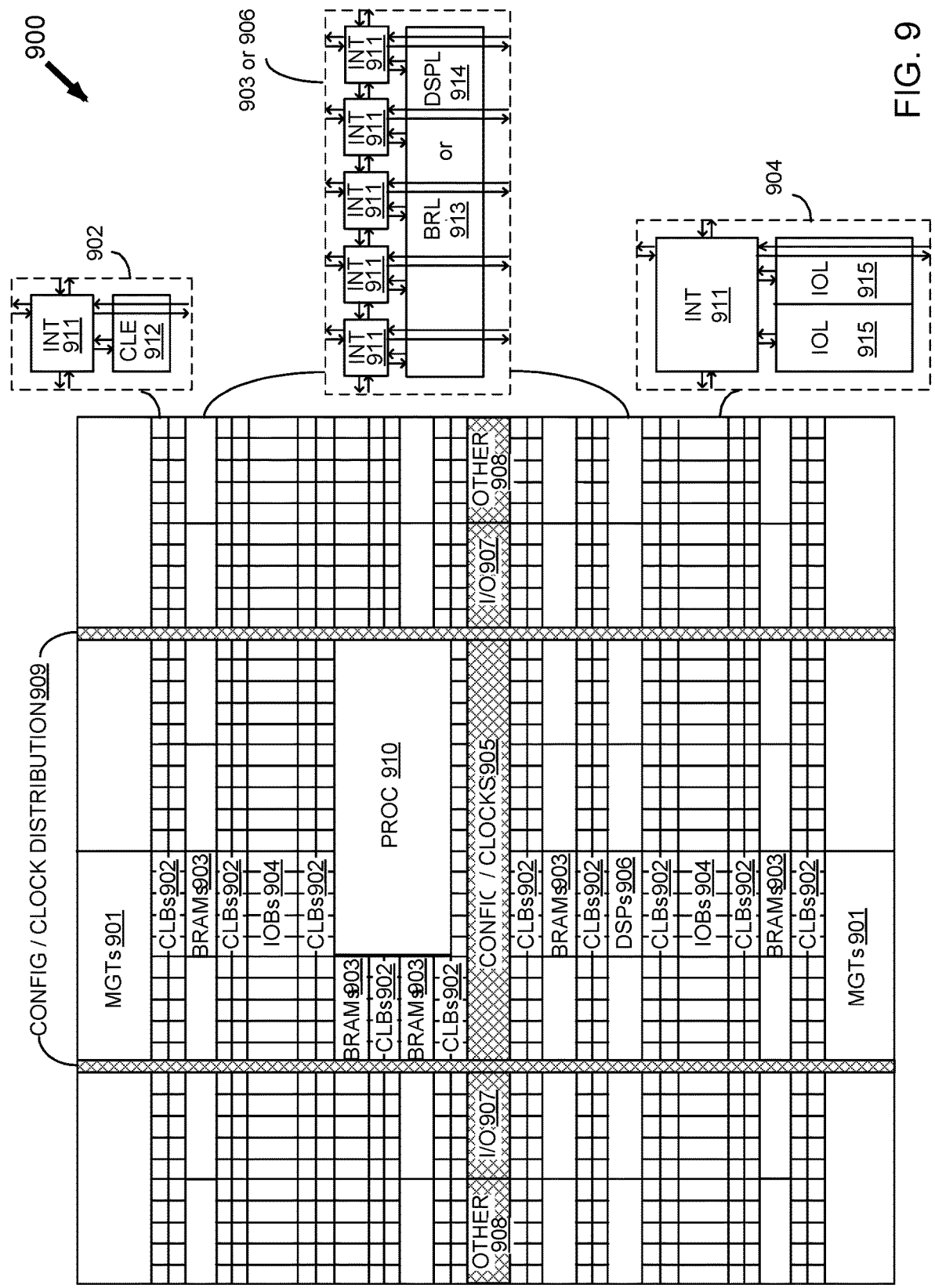
FIG. 9 is a simplified block diagram depicting an exemplary columnar Field Programmable Gate Array ("FPGA") architecture.

As noted above, advanced FPGAs can include several different types of programmable logic blocks in the array. For example, FIG. 9 illustrates an FPGA architecture 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908 such as digital clock managers, analog-to-digital converters, system monitoring logic, and so forth. Some FPGAs also include dedicated processor blocks ("PROC") 910.

In some FPGAs, each programmable tile includes a programmable interconnect element ("INT") 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element ("DSPL") 914 in addition to an appropriate number of programmable interconnect elements. An 10B 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured embodiment, a horizontal area near the center of the die (shown in FIG. 9) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 910 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 10:
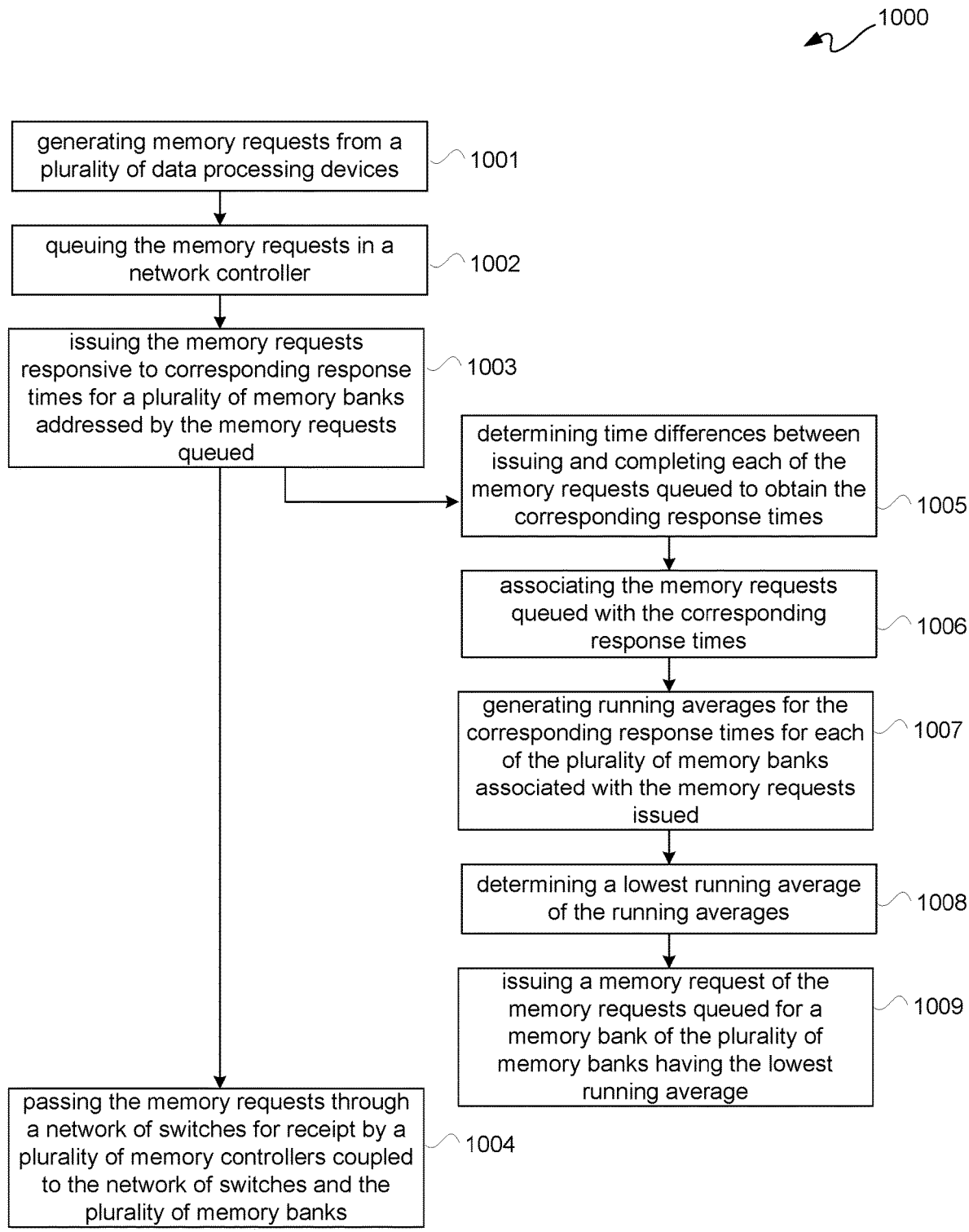
FIG. 10 is a flow diagram depicting an exemplary memory request scheduling flow.

FIG. 10 is a flow diagram depicting an exemplary memory request scheduling flow 1000. Memory request scheduling flow 1000 may be used in an integrated circuit device. Memory request scheduling flow 1000 is further described with simultaneous reference to FIGS. 1 through 4, 6-8 and 10.

At operation 1001, memory requests 305 may be generated from one or more data processing devices 105, 300. At operation 1002, such memory requests 305 may be queued in a network controller 101, 400.

At operation 1003, memory requests 305 may be issued responsive to corresponding response times 417 for a plurality of memory banks 104 addressed by such memory requests 305 queued. Round-trip net times or corresponding response times 417 may be associated with corresponding memory requests, and lengths of such corresponding response times 417 may be used to effectively identify which memory page(s) are open or active (i.e., shorter response times) and which memory page(s) are closed or inactive (i.e., longer response times). At operation 1004, memory requests 305 may be passed through a network of switches 102 for receipt by a plurality of memory controllers 103, 200 coupled to such network of switches 102 and such plurality of memory banks 104.

For issuing of memory requests of memory requests 305 queued at 1003, at operation 1005 time differences may be determined between issuing and completing each of memory requests 305 queued to obtain corresponding response times 417. At operation 1006, memory requests 305 queued may be associated with the corresponding response times 417.

For issuing of memory requests of memory requests 305 queued at 1003, at operation 1007 running averages 617 may be generated for corresponding response times 417 for each of memory banks 104 associated with memory requests 305 issued. At operation 1008, a lowest running average of running averages 617 may be determined. At operation 1009, a memory request of memory requests 305 queued may be issued for a memory bank of memory banks 104 having such a lowest running average. Along those lines, correspond response times 417 may effectively be ranked or queued from shortest to longest for issuing queued memory requests 305, which may be issued out-of-sequence with respect to when such memory requests 305 are queued. Queued memory request 305 may be issued in an out-of-sequence order, where such order of issuances is from shortest-to-longest of corresponding response times 417 with shorter times being issued before longer times for such out-of-sequence execution.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for an integrated circuit device, comprising:
   a plurality of memory controllers configured to be coupled to a plurality of memory banks of a memory;
   a network of switches coupled to the plurality of memory controllers;
   a plurality of data processing devices coupled to the network of switches and configured to generate memory requests;
   a network controller coupled to the network of switches and configured to queue the memory requests, associate the memory requests queued with corresponding response times associated with the plurality of memory banks, and selectively issue requests to the memory from the memory requests queued responsive to the corresponding response times associated with the plurality of memory banks; and
   a request scheduler circuit in the network controller coupled to receive the corresponding response times and configured to issue a memory request of the memory requests queued for a memory bank of the plurality of memory banks based on running averages for the corresponding response times for the plurality of memory banks associated with the memory requests issued.

2. The apparatus according to claim 1, wherein:
   the network controller is configured to determine differences between a pick time and a corresponding response time for each of the memory requests to memory to obtain the corresponding response times.

3. The apparatus according to claim 2, wherein the network controller is configured with:
   a pick time counter circuit configured to store pick times corresponding to the memory requests issued;
   a total number of requests picked counter circuit configured to store request counts for each of the pick times stored;
   a total response time counter circuit configured to generate the corresponding response times by respectively subtracting the pick times from received completion times for the memory requests issued and completed; and
   wherein the request scheduler circuit is configured to:
   generate the running averages;
   determine a lowest running average of the running averages; and
   issue a memory request of the memory requests queued for a memory bank of the plurality of memory banks having the lowest running average.

4. The apparatus according to claim 2, wherein the network of switches includes programmable interconnect circuits of programmable logic fabric.

5. The apparatus according to claim 2, wherein the corresponding response times are indicative of memory pages being open.

6. The apparatus according to claim 5, wherein the memory requests include at least one of memory write commands or memory read commands for out-of-sequence execution responsive to shortest to longest of the corresponding response times.

7. The apparatus according to claim 6, wherein the plurality of memory banks are accessible with at least one of page reads or page writes.

8. The apparatus according to claim 3, wherein:
   the network controller is configured to count each instance of not being selected for issuance for each of the memory requests queued respectively therein to provide corresponding starvation counts; and
   the network controller is configured to issue each memory request of the memory requests queued having a starvation count of the starvation counts exceeding a count threshold.

9. The apparatus according to claim 3, wherein at least one switch of the network of switches is configured as an arbiter, the arbiter configured to:
   receive a subset of the memory requests issued from the network controller;
   queue the subset of the memory requests received in the arbiter; and
   issue a memory request from the subset of the memory requests responsive to the corresponding response times for the plurality of memory banks addressed by the subset of the memory requests queued in the arbiter.

10. The apparatus according to claim 1, wherein the issued memory request is for a first memory bank of the plurality of memory banks having a running average of the running averages less than a running average of the running averages of a second memory bank of the plurality of memory banks.

11. The apparatus according to claim 10, wherein the running average of the first memory bank is the shortest running average of the running averages.

12. An apparatus for an integrated circuit device, comprising:
a plurality of memory controllers configured to be coupled to a plurality of memory banks of a memory;
a network of switches coupled to the plurality of memory controllers;
a plurality of data processing devices coupled to the network of switches and configured to generate memory requests;
a network controller coupled to the network of switches;
switches of the network of switches configured as arbiters, the arbiters configured to queue the memory requests, associate the memory requests queued with corresponding response times for the plurality of memory banks, and issue requests to the memory from, and issue the memory requests queued therein responsive to the corresponding response times for the plurality of memory banks; and
a request scheduler circuit in each of the arbiters coupled to receive the corresponding response times and configured to issue a memory request of the memory requests queued for a memory bank of the plurality of memory banks based on running averages for the corresponding response times for each of the plurality of memory banks respectively associated with the arbiters for the memory requests issued.

13. The apparatus according to claim 12, wherein:
each of the arbiters is configured to determine differences between a pick time and a corresponding response time for each of the memory requests issued from the arbiters to obtain the corresponding response times.

14. The apparatus according to claim 13, wherein each of the arbiters is configured with:
a pick time counter circuit configured to store pick times corresponding to the memory requests issued;
a total number of requests picked counter circuit configured to store request counts for each of the pick times stored;
a total response time counter circuit configured to generate the corresponding response times by respectively subtracting the pick times from received completion times for the memory requests issued and completed; and
wherein the request scheduler circuit is configured to:
generate the running averages;
determine a lowest running average of the running averages; and
issue a memory request of the memory requests queued for a memory bank of the plurality of memory banks having the lowest running average.

15. The apparatus according to claim 13, wherein the network of switches includes programmable interconnect circuits of programmable logic fabric.

16. The apparatus according to claim 13, wherein the corresponding response times are indicative of memory pages being open.

17. The apparatus according to claim 16, wherein the memory requests include at least one of memory write commands or memory read commands for out-of-sequence execution responsive to shortest to longest of the corresponding response times.

18. The apparatus according to claim 14, wherein:
each of the arbiters is configured to count each instance of not being selected for issuance for each of the memory requests queued respectively therein to provide corresponding starvation counts; and
each of the arbiters configured to issue each memory request of the memory requests queued having a starvation count of the starvation counts exceeding a count threshold.

19. A method for an integrated circuit device, comprising:
generating memory requests from a plurality of data processing devices;
queuing the memory requests in a network controller;
associating, in the network controller, the memory requests queued with corresponding response times for a plurality of memory banks of a memory addressed by the memory requests queued;
issuing, by the network controller to the memory, the memory requests responsive to the corresponding response times for the plurality of memory banks addressed by the memory requests queued based on running averages for the corresponding response times for each of the plurality of memory banks associated with the memory requests issued; and
passing the memory requests through a network of switches for receipt by a plurality of memory controllers coupled to the network of switches and the plurality of memory banks.

20. The method according to claim 19, wherein the issuing of the memory requests comprises:
determining time differences between issuing and completing each of the memory requests queued to obtain the corresponding response times.

21. The method according to claim 20, wherein the issuing of the memory requests comprises:
generating the running averages;
determining a lowest running average of the running averages; and
issuing a memory request of the memory requests queued for a memory bank of the plurality of memory banks having the lowest running average.

* * * * *